(12) United States Patent
Lin (10) Patent No.: US 8,096,627 B2
(45) Date of Patent: Jan. 17, 2012

(54) LATCH APPARATUS TO AN ENCLOSURE FOR AN ELECTRONIC DEVICE

(75) Inventor: Ian Lin, Taipei (TW)

(73) Assignee: International Business Machines Corporation, Armonk, NY (US)

( * ) Notice: Subject to any disclaimer, the term of this patent is extended or adjusted under 35 U.S.C. 154(b) by 619 days.

(21) Appl. No.: 12/199,892

(22) Filed: Aug. 28, 2008

(65) Prior Publication Data

US 2009/0058236 A1 Mar. 5, 2009

(30) Foreign Application Priority Data

Aug. 28, 2007 (TW) .............................. 96131819 A (51) Int. Cl.
*A47B 95/00* (2006.01)
(52) U.S. Cl. .................................... 312/325; 312/223.2
(58) Field of Classification Search .... 312/223.1–223.3, 312/333, 325, 326–329, 265.5, 263, 334.2; 292/137, 138, 139, 140, 143, DIG. 11; 361/679.02, 361/679.33–679.37, 679.43, 679.58, 724–727; 70/84, DIG. 73
See application file for complete search history.

(56) References Cited

U.S. PATENT DOCUMENTS

| | | | | |
|---|---|---|---|---|
| 178,933 | A * | 6/1876 | Jennings | 292/173 |
| 2,944,864 | A * | 7/1960 | Krivulka | 312/332.1 |
| 5,495,389 | A * | 2/1996 | Dewitt et al. | 361/679.57 |
| 5,761,045 | A * | 6/1998 | Olson et al. | 361/726 |
| 5,823,644 | A * | 10/1998 | Suh et al. | 312/223.2 |
| 6,362,975 | B1 * | 3/2002 | Liu et al. | 361/796 |
| 6,373,692 | B1 * | 4/2002 | Cheng | 361/679.59 |
| 6,404,641 | B1 * | 6/2002 | Fisk et al. | 361/727 |
| 6,515,855 | B1 * | 2/2003 | Removedummy | 361/679.33 |
| 6,538,882 | B2 * | 3/2003 | Branch et al. | 361/679.02 |
| 6,761,421 | B2 | 7/2004 | Chen et al. | |
| 6,795,307 | B2 | 9/2004 | Arbogast et al. | |
| 7,420,812 | B2 * | 9/2008 | Chen et al. | 361/724 |
| 7,428,835 | B2 * | 9/2008 | Fan et al. | 70/358 |
| 2004/0222647 | A1 | 11/2004 | Smith et al. | |
| 2006/0291155 | A1 * | 12/2006 | Chen et al. | 361/726 |

* cited by examiner

*Primary Examiner* — Darnell Jayne
*Assistant Examiner* — Sasha T Varghese
(74) *Attorney, Agent, or Firm* — Joseph Petrokaitis (57) ABSTRACT

A latch apparatus for a cover and a housing is mounted on at least one side in a front of the housing. The latch apparatus includes a bracket rotatably attached to at least one outer side in a front of the housing and a linkage coupled to the bracket. When the bracket is rotated in a first direction, the linkage applies a force on the cover relative to the housing for detachment of the cover from the housing.

16 Claims, 15 Drawing Sheets

LATCH APPARATUS TO AN ENCLOSURE FOR AN ELECTRONIC DEVICE

BACKGROUND OF THE INVENTION

The present invention relates to a novel latch apparatus for latching a top cover to a housing for an electronic device such as a computer.

Electronic devices, such as computer systems, often have a removable panel or cover to provide access to components and circuitry disposed within a housing or chassis for component installation or replacement. These removable covers are generally coupled to the housing by a threaded fastener, such as a screw, or other tool-based fasteners for tight engagement to fulfill electromagnetic compatibility (EMC) and fragility requirements. Unfortunately, the required tight fit between cover and chassis makes cover removal or installation difficult. In addition, tool-based fasteners require a considerable amount of time and effort to remove or attach.

SUMMARY OF THE INVENTION

In a first aspect of the invention, a latch apparatus for a cover and a housing mounted on at least one side in a front of the housing includes a bracket rotatably attached to at least one outer side in the front of the housing and a linkage means coupled to the bracket, whereby the linkage means applies a force on the cover relative to the housing for detachment of the cover from the housing when the bracket is rotated in a first direction.

In another aspect of the invention, an enclosure includes a cover, a housing, and a latch apparatus mounted on at least one side in a front of the housing, including, a bracket rotatably attached to at least one outer side in the front of the housing and a linkage means coupled to the bracket, whereby the linkage means applies a force on the cover relative to the housing for detachment of the cover from the housing when the bracket is rotated in a first direction.

In a further aspect of the invention, a method for applying a force on a cover relative to a housing includes rotating, in a first direction, a bracket attached to at least one outer side in a front of the housing and transforming a rotation movement of rotating the bracket into a displacement movement in order to apply a force on the cover relative to the housing for detachment of the cover from the housing.

DETAILED DESCRIPTION OF EMBODIMENTS OF THE INVENTION

Figure 1A:
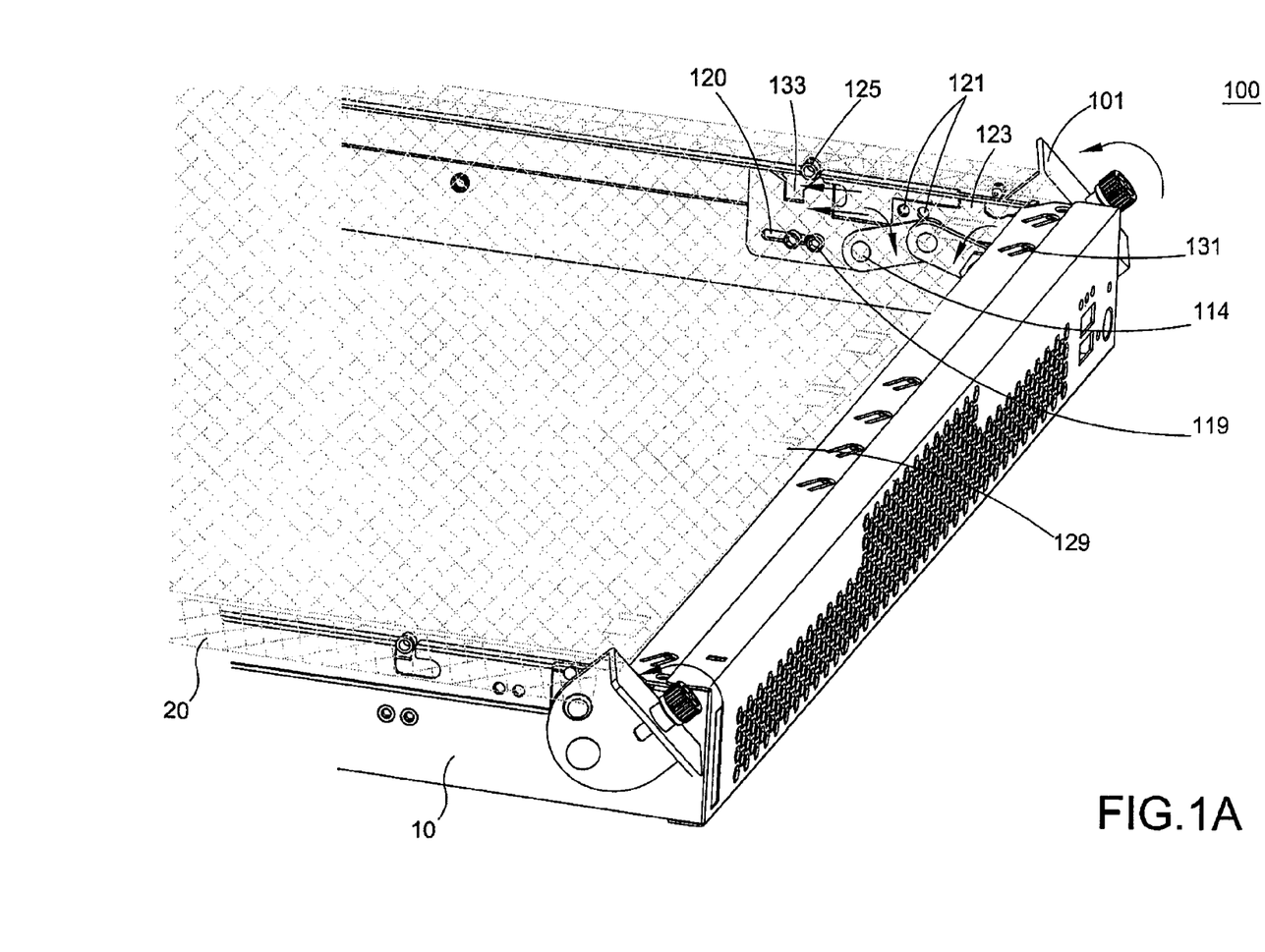
FIGS. 1A-1B show an assembled perspective view and exploded perspective view of a cover latch, a cover and a housing according to a first embodiment of the present invention.
Figure 1B:
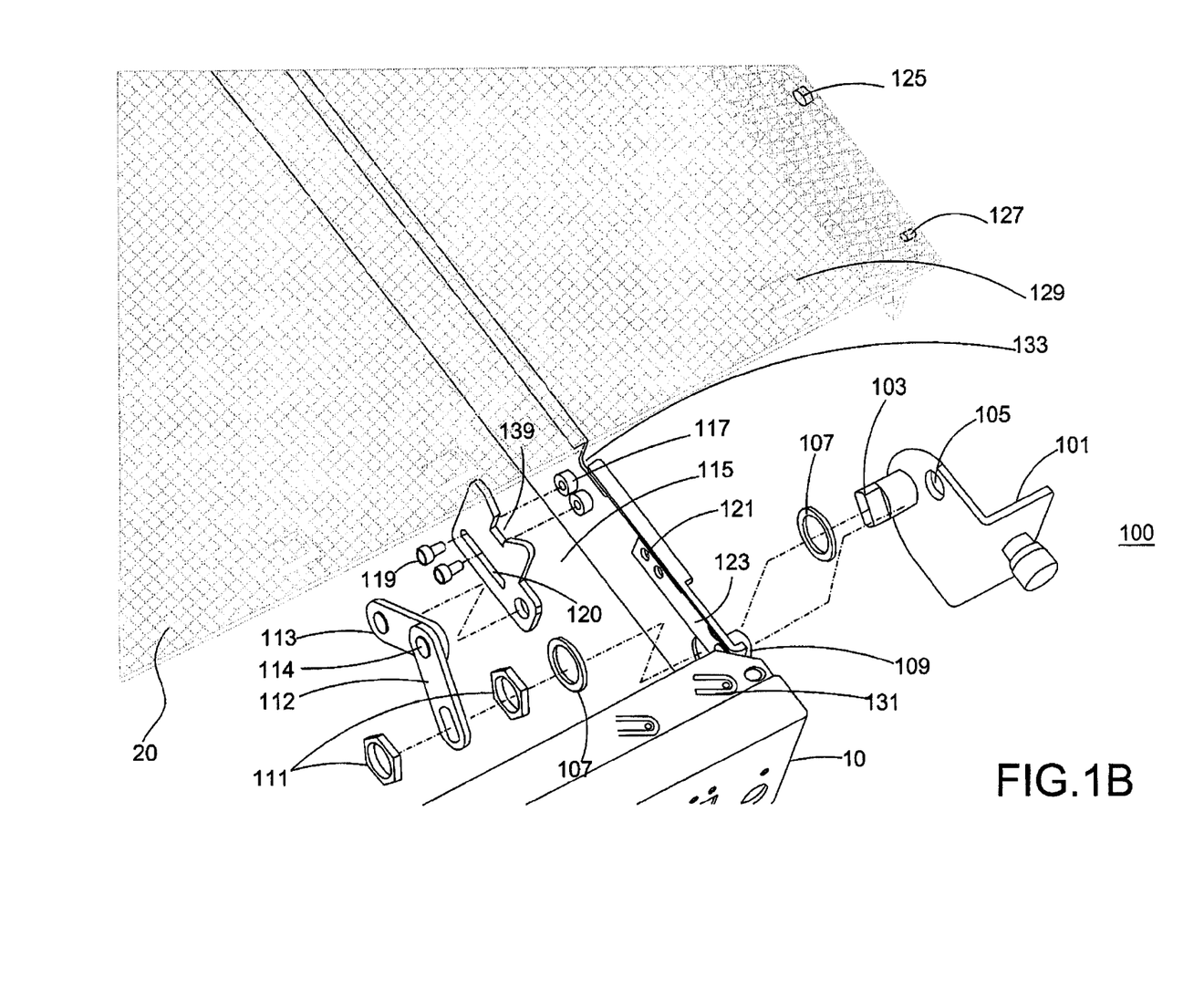

Referring to FIGS. 1A-1B, a cover latch 100 is mounted on at least one side in front of a housing 10, preferably on both sides of the housing 10 to apply a more balanced force to conveniently detach a cover 20 from the housing 10. An inner side of at least one side panel of the housing 10 includes a threaded stud 117 and a L-shaped cut 133. An inner side of at least one side panel of the cover 20 also includes a stud 125 and a latch release pin 127. A front edge of the cover 20 includes a plurality of recessed tabs 129. The cover 20 is removably coupled to the housing 10 via recessed tabs 129 interlocked with mating slots disposed on an upper side of the front edge of the housing 10. The slots on the housing 10 further comprise a plurality of spring fingers 131 each having a contact thereon for contacting the cover 20 to provide an EMC contact for electromagnetic interference (EMI) shielding, when the cover 20 is engaged and interlocked with the housing 10. The cover latch 100 according to an embodiment of the present invention comprises a bracket 101, a slide 115, a linkage set comprising a first linkage 112 and a second linkage 113, and a bracket latch component comprising a spring latch 123 and a push-button 109. The bracket 101 is an existing Electronic Industries Association (EIA) rack-mount bracket mounted on a rack-mount system. The bracket 101 comprises an opening 105 and a threaded axle 103. When the bracket 101 is in a normal position, the push-button 109 passes through the opening 105 to place the bracket 101 in a bracket latch state. Bracket 101 is locked (latched).

The EIA brackets may be positioned in front of a housing on both sides, thereby providing the following advantages when working as a cover latch: (1) being operation friendly when used on a rack-mount enclosure; (2) not occupying a space inside the housing for components; (3) applying a more balanced force to conveniently detach the cover from the housing when exerting forces on both sides; and (4) minimizing the impact to an exterior of the enclosure, as there are no additional parts visible outside the housing.

Figure 3A:
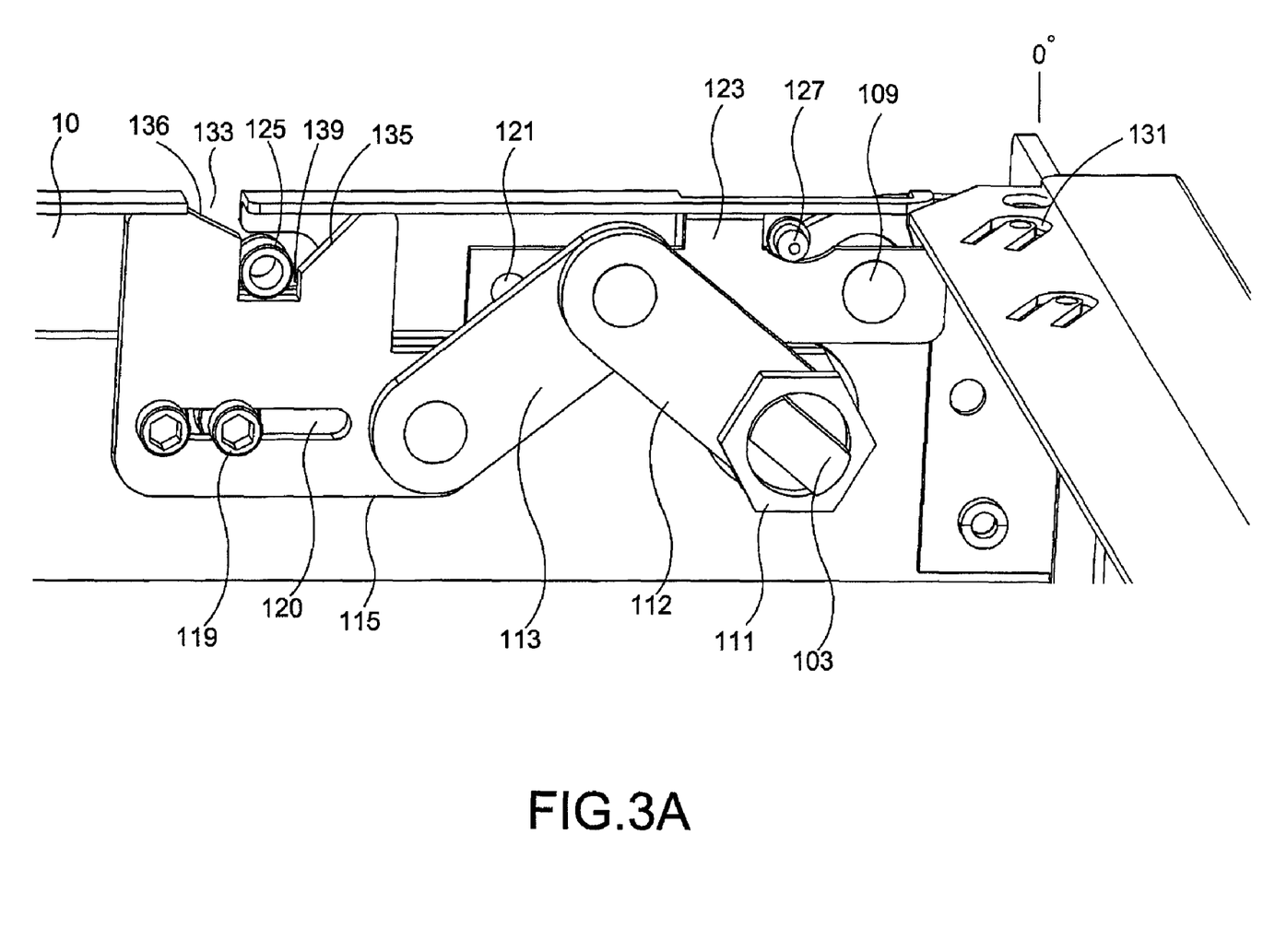
FIGS. 3A-3C depict cross-sectional side views of detaching the cover from the housing according to the first embodiment of the present invention.

The threaded axle 103 disposed on the bracket 101 may be engaged with the first linkage 112 of the linkage set by using washers 107 which provide friction and nuts 111. The slide 115 comprises a longitudinal slot 120 and a recessed cut 139 with a first ramp 135 and a second ramp 136 (as shown in FIG. 3A). The second linkage 113 is connected to the slide 115 by a rivet 114. Two guide pins 119 pass through the longitudinal slot 120 of the slide 115 and may be fastened to the threaded stud 117 disposed on the inner side of at least one side panel of the housing 10, such that the slide 115 may slide against the guide pins 119. In addition, the spring latch 123 is fastened to the inner side of the housing 10 by a rivet 121.

Figure 2:
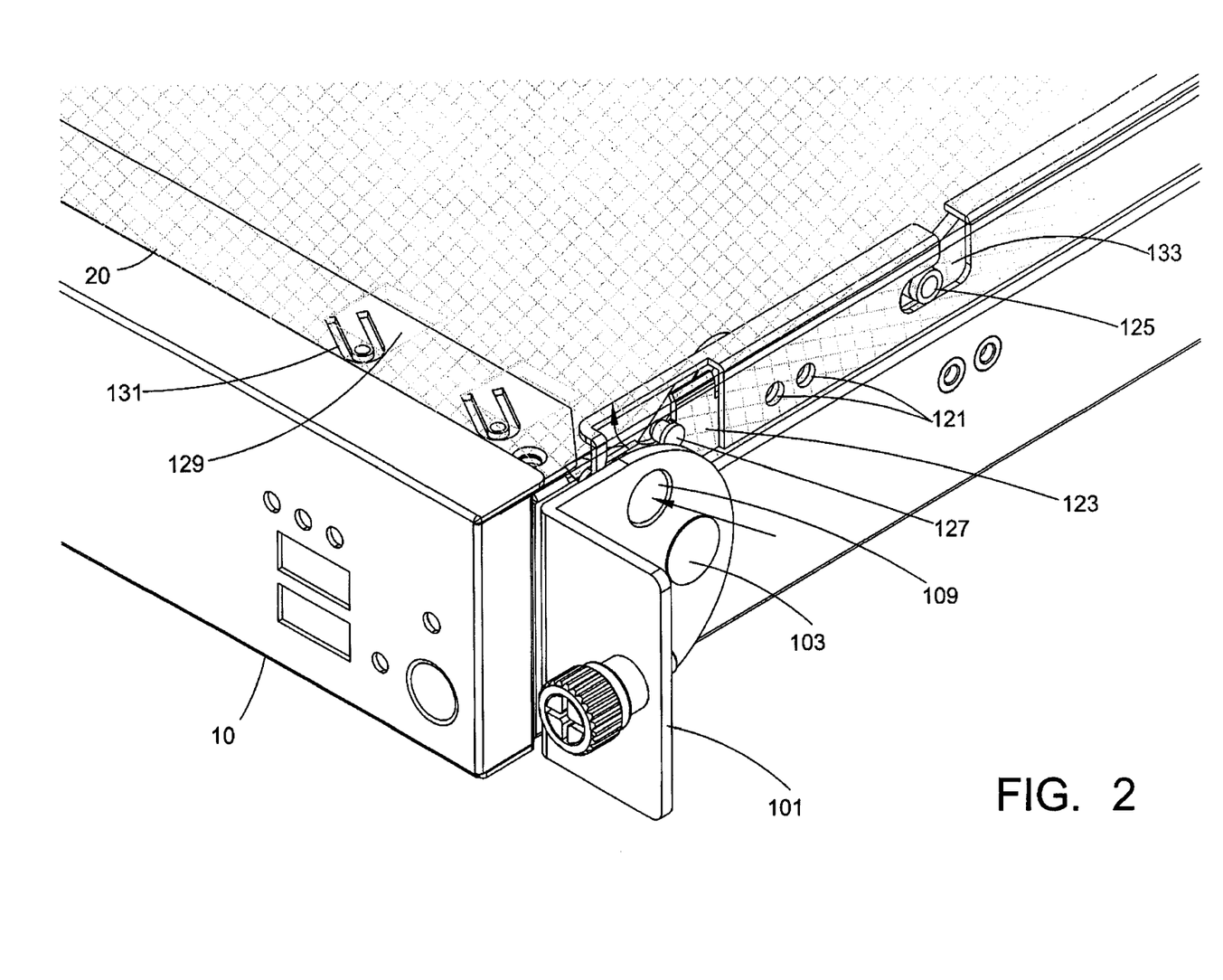
FIG. 2 shows an assembled perspective view according to the first embodiment of the present invention, wherein the cover latch, the cover and the housing are in a closed position.
Figure 5A:
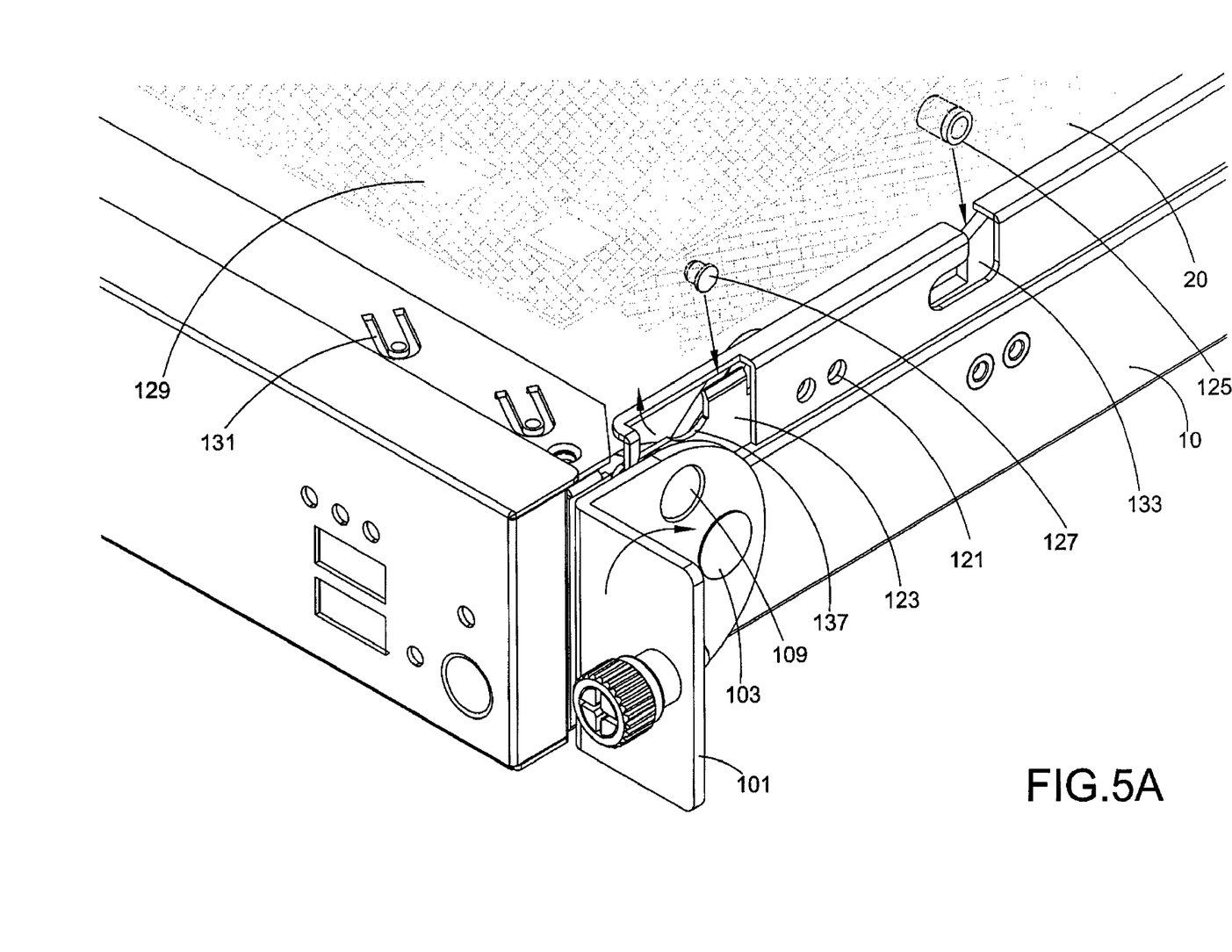
FIGS. 5A-5C depict assembled perspective views engaging and interlocking the cover with the housing when a bracket is in a bracket latch state according to the first embodiment of the present invention.

Referring to FIG. 2, when the housing 10 and the cover 20 are in a closed position, the bracket 101 is placed in a normal position. The push-button 109 passes through the opening 105 to place the bracket 101 in a bracket latch state. The bracket 101 cannot be rotated. When the stud 125 on the inner side of the cover 20 is placed on the horizontal side of the L-shaped cut 133, the cover 20 is installed on the housing 10 to place the cover 20 in the closed position. At this moment, the latch release pin 127 is placed in a recessed area 137 (as shown in FIG. 5A) of the spring latch 123.

Figure 3B:
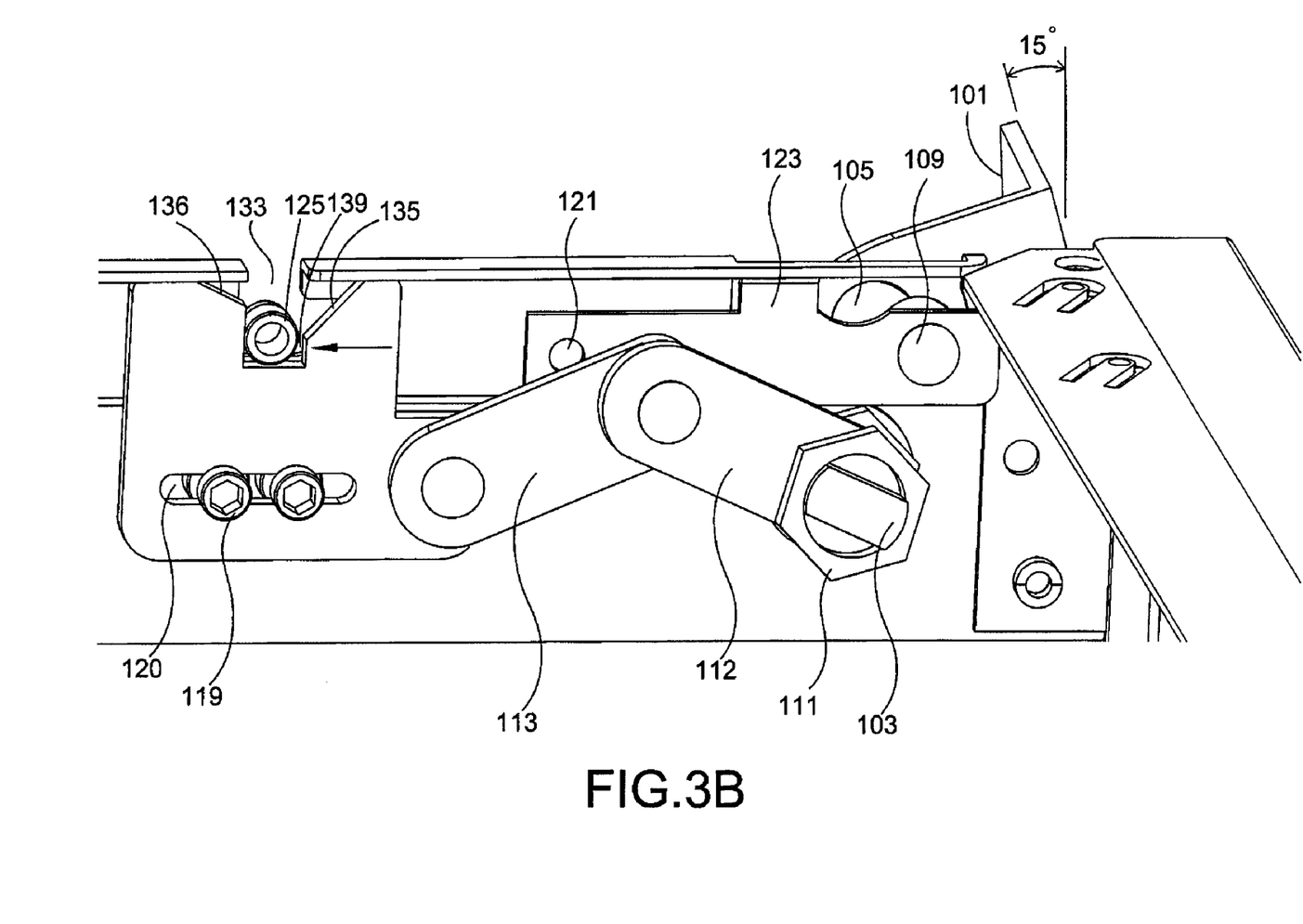
Figure 3C:
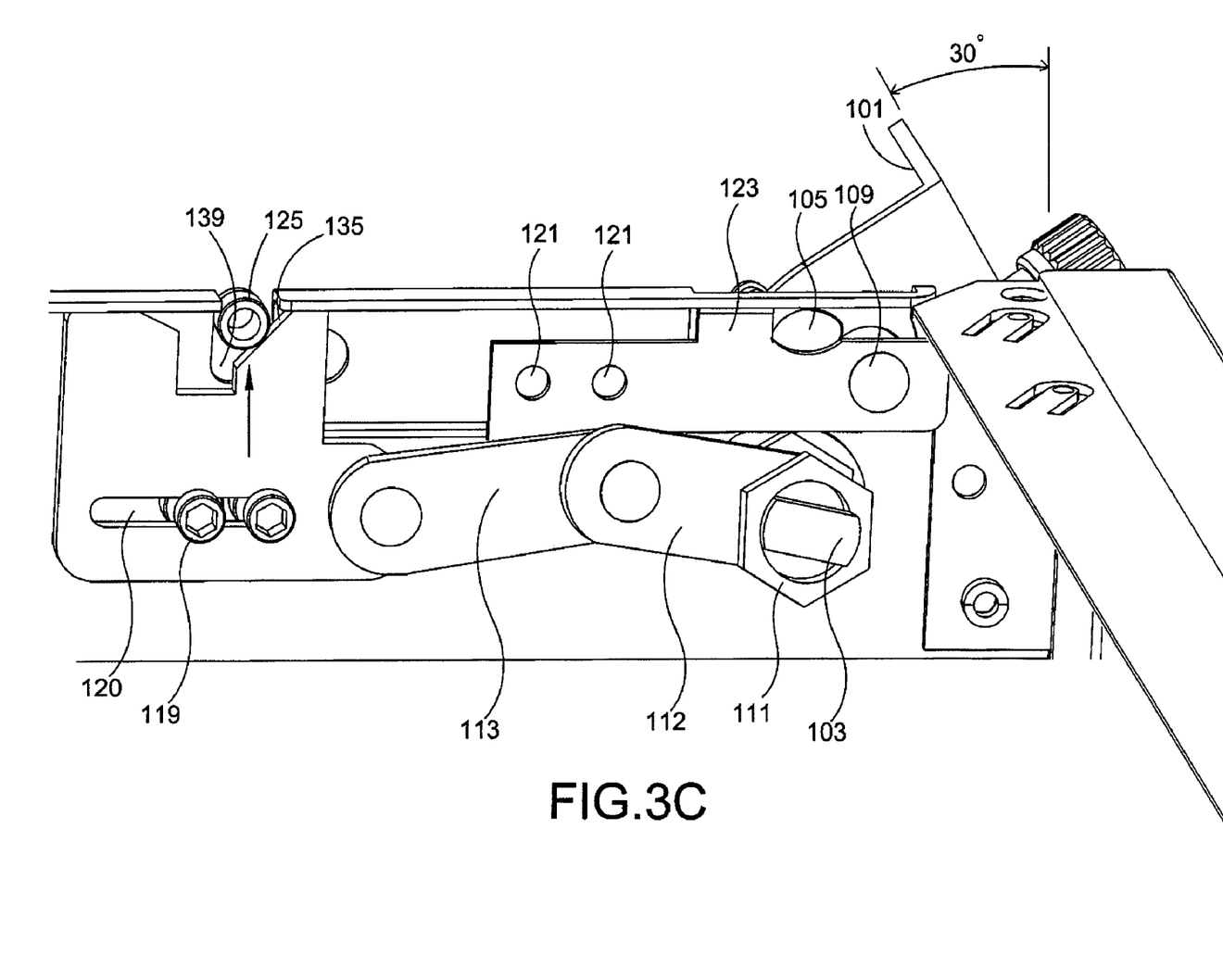

Referring to FIGS. 3A-3C, when the button 109 of the bracket latch component is pressed, the spring latch 123 bends to make the button 109 exit from the opening 105 on the bracket 101. The bracket 101 leaves the bracket latch state. Next, as shown in FIG. 3B, the bracket 101 is turned forward a first angle (e.g. around 15 degrees vs. the vertical closed position). The button 109 exits from the opening 105. The linkage set, comprising the first linkage 112 and the second linkage 113, transforms a rotation movement of the bracket 101 into a displacement movement of the slide 115. The stud 125 of the cover 20 placed within the recessed cut 139 of the slide 115 is pushed left by the slide 115 along the horizontal side of the L-shaped cut 133. The cover 20 leaves the closed position and is disengaged from the housing 10.

Referring to FIG. 3C, the bracket 101 is turned forward a second angle greater than the first angle (e.g. around 30 degrees vs. the vertical closed position). The stud 125 on the cover 20 is moved upward by the first ramp 135 of the recessed cut 139 of the slide 115 along the vertical side of the L-shaped cut 133. The cover 20 is opened and lifted up a bit for removal convenience.

Referring to FIGS. 4A-5A, no matter what orientation the bracket 101 is in, when the latch release pin 127 and the stud 125 of the cover 20 respectively aim at the spring latch 123 and L-shaped cut 133, pressing the cover 20 downward to the housing 10 makes the latch release pin 127 of the cover 20 press the spring latch 123 and bends it to detach the button 109 of the bracket latch component from the opening 105 on the bracket 101. The bracket 101 leaves the bracket latch state to facilitate movement of the slide 115. The stud 125 of the cover 20 will act with the first ramp 135 and the second ramp 136 of the recessed cut 139 of the slide 115 to adjust the position of the slide 115 until the stud 125 falls into L-shaped cut 133 of the housing 10. The bracket 101 may then be turned forward an angle (e.g. around 15 degrees).

Figure 5B:
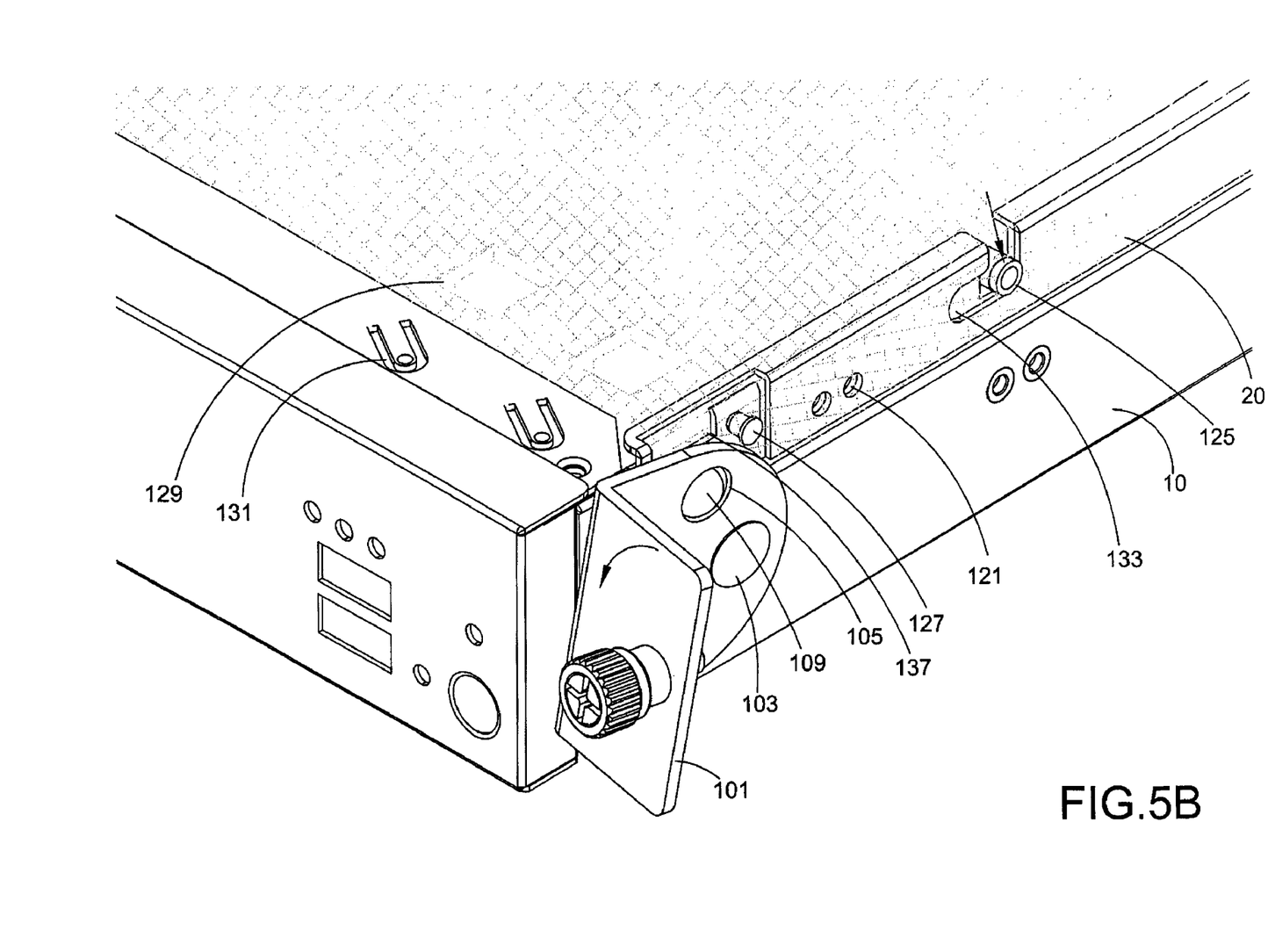

Referring to FIG. 5B, a relative position among the bracket 101, the button 109, the opening 105, the latch release pin 127, the spring latch 123 and the stud 125 when the bracket 101 is turned forward a first angle (e.g. around 15 degrees) are shown. As the stud 125 of the cover 20 falls into the L-shaped cut 133, the bracket 101 is turned backward to the normal position. At this moment, the linkage set 112, 113 transforms a rotation movement of the bracket 101 into a displacement movement of the slide 115 again. The stud 125 of the cover 20 being placed within the recessed cut 139 of the slide 115 is pushed right by the slide 115 along the horizontal side of the L-shaped cut 133. The cover 20 is installed on the housing 10 in the closed position.

Figure 4A:
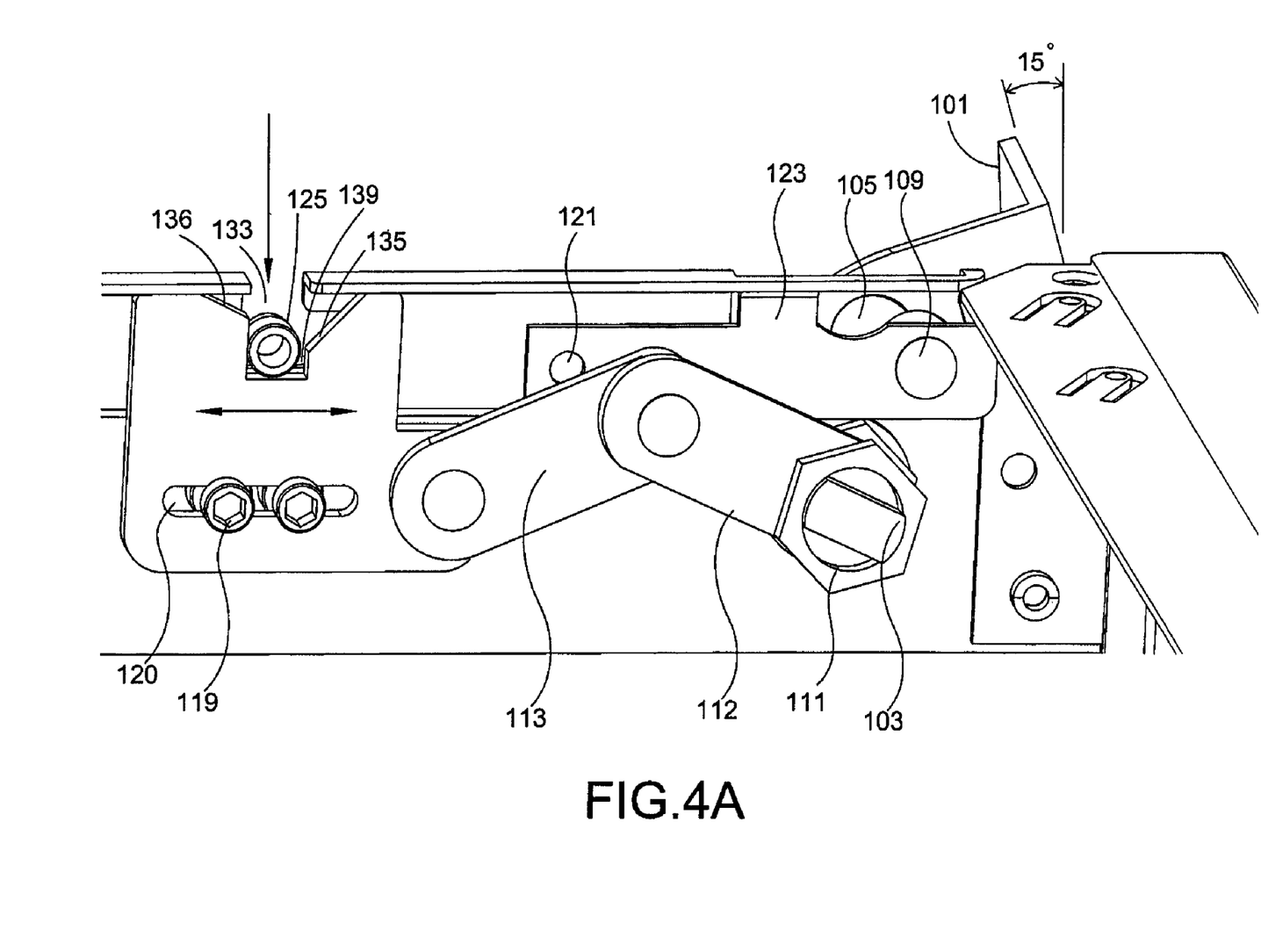
FIGS. 4A-4B depict cross-sectional side views of engaging and interlocking the cover with the housing according to the first embodiment of the present invention.
Figure 4B:
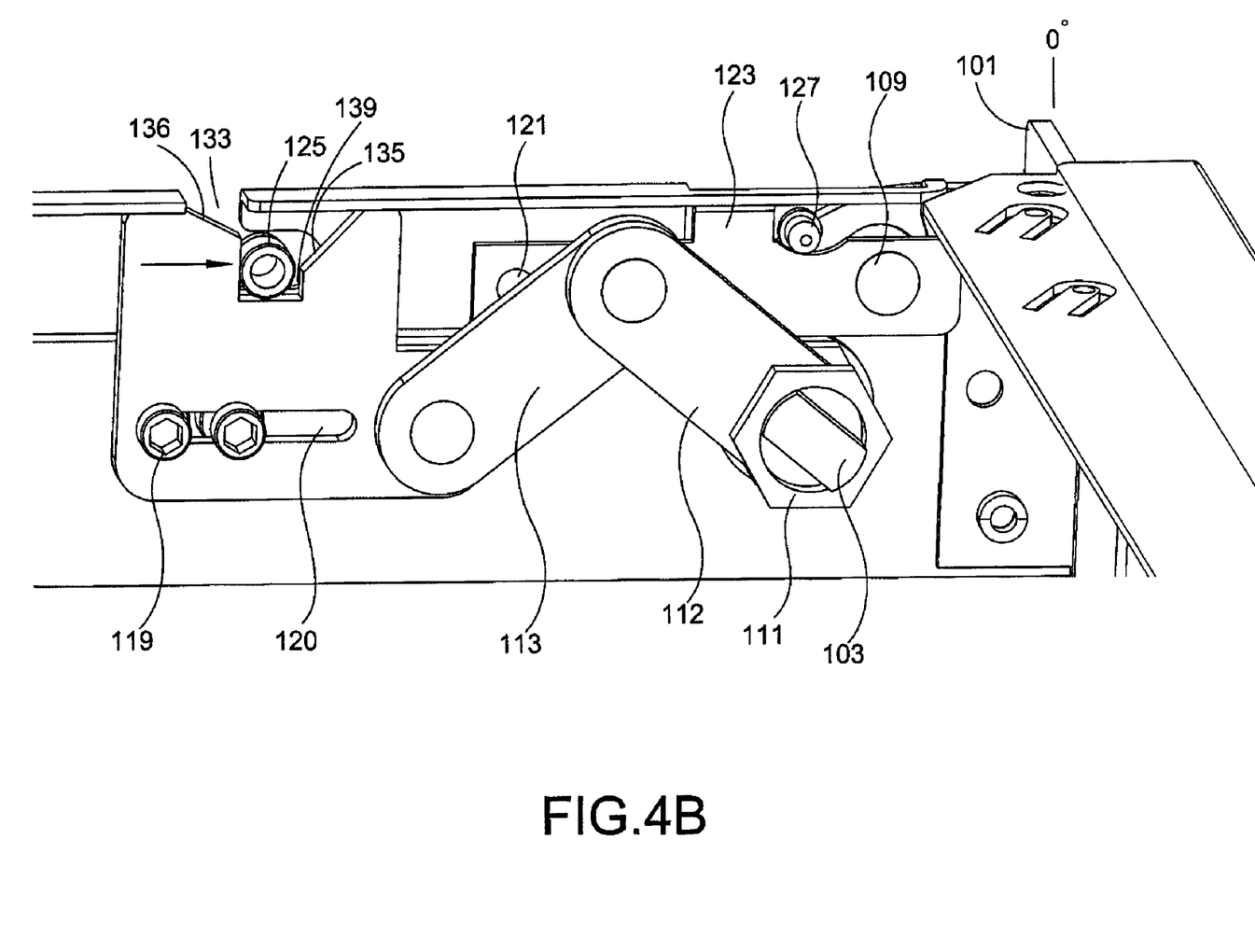
Figure 5C:
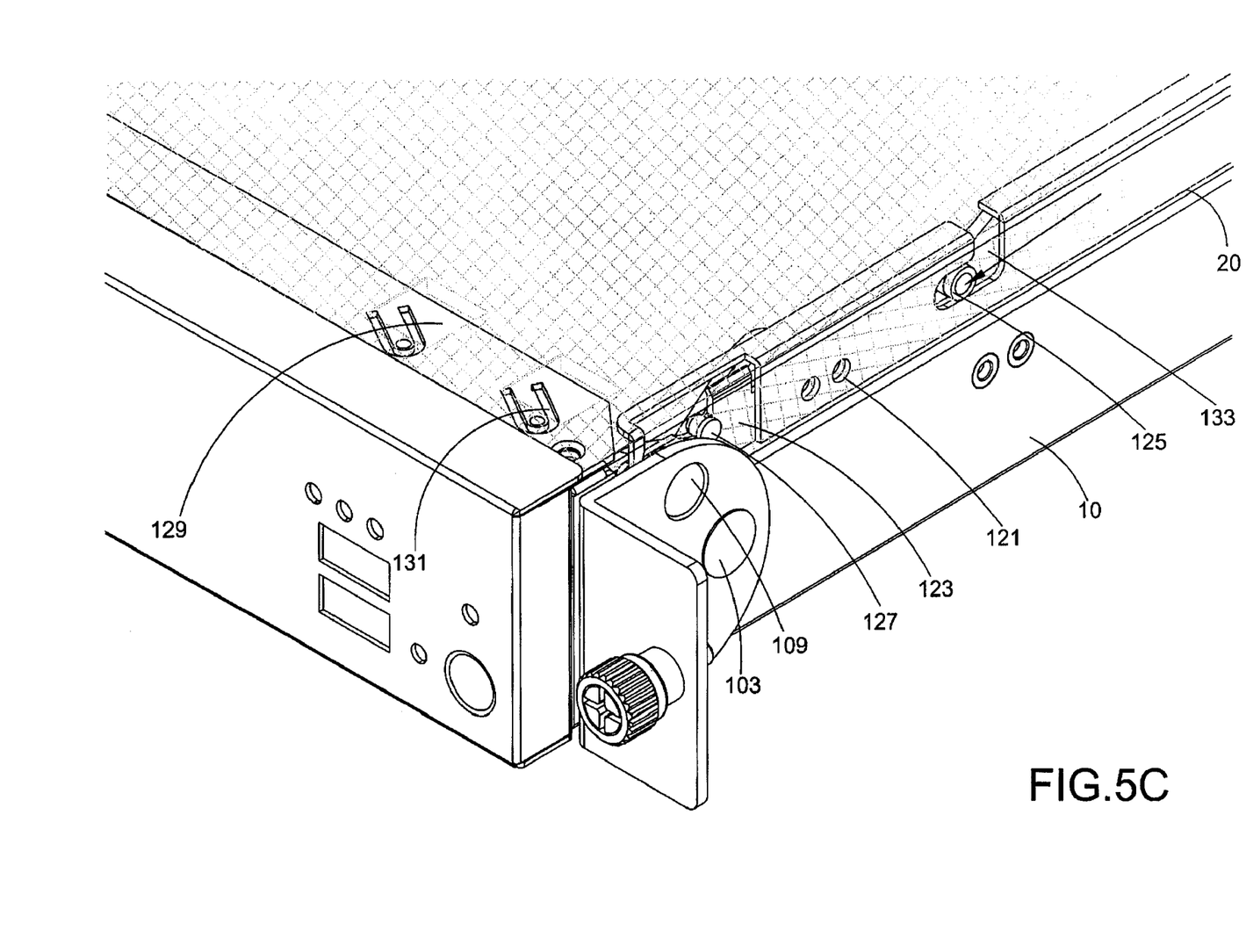

Referring to FIG. 4B and FIG. 5C, the cover 20 and the housing 10 are in a closed position. The cover 20 is removably coupled to the housing 10 via recessed tabs 129 interlocked with mating slots disposed on the upper side of the front edge of the housing 10. As described above, the slots on the housing 10 comprise a plurality of spring fingers 131 each having a contact thereon for contacting the cover 20 to provide an EMC contact for EMI shielding, when the cover 20 is engaged and interlocked with the housing 10. The stud 125 is placed on the horizontal side of the L-shaped cut 133 of the housing 10 The latch release pin 127 slips into the recessed area 137 of the spring latch 123. The button 109 passes through the opening 105 of the bracket 101 to place the bracket 101 back in the bracket latch state ensuring that the bracket 101 cannot be rotated.

Figure 6:
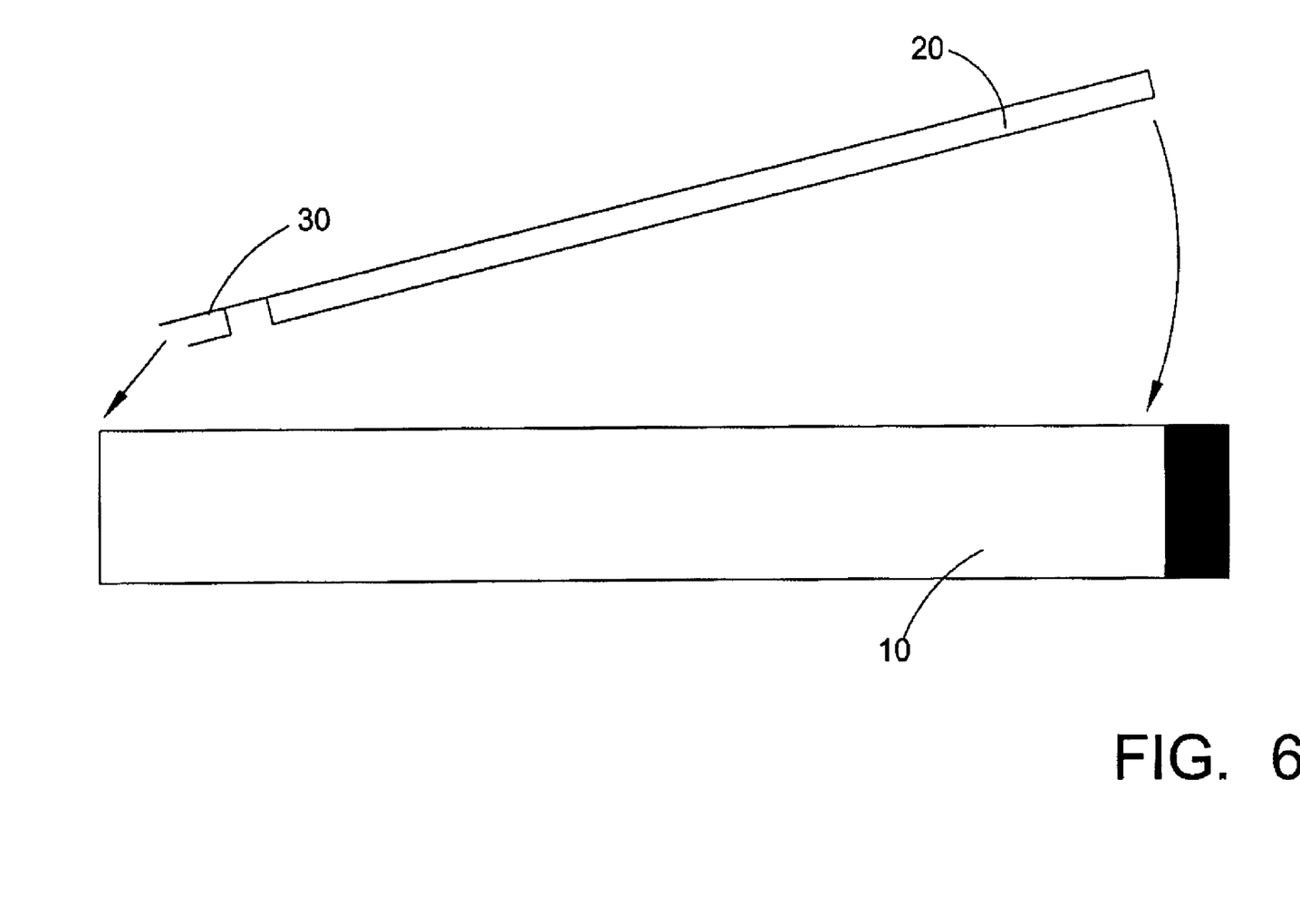
FIG. 6 depicts an embodiment of a housing in accordance with an embodiment of the invention.

Referring to FIG. 6, in some applications of a housing 10 of electronic devices, a cover 20 is designed to be closed or opened by a pivoting motion (e.g. sliding). When closing the cover 20, a latch component 30 at the rear side of the cover 20 will be engaged with the housing 10 at the rear end at an angle. The cover 20 is moved downward by pivoting until it hooks up with the housing 10. Following the inverse steps opens the cover.

Figure 7:
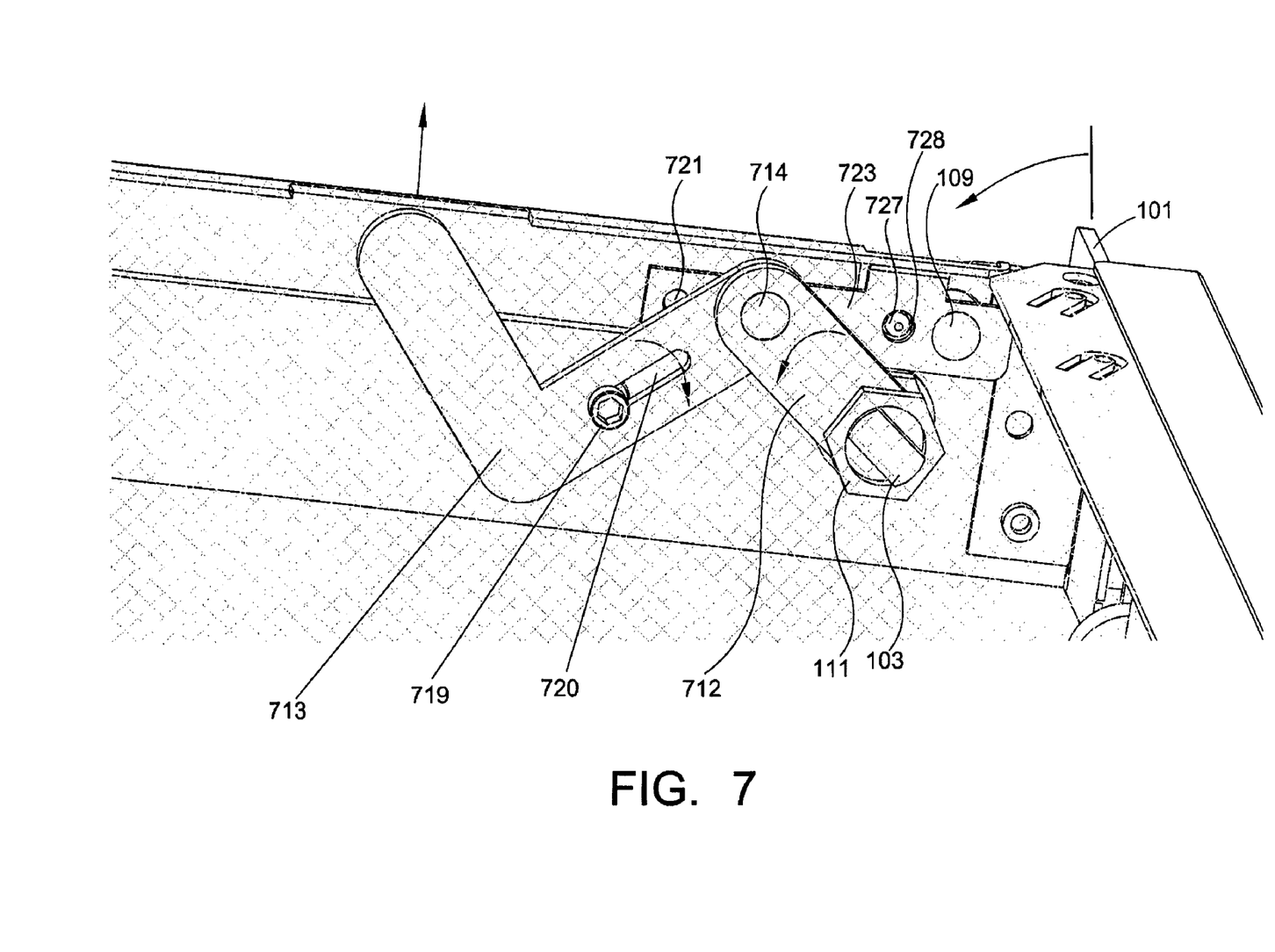
FIG. 7 depicts a cross-sectional side view of a second embodiment of a cover latch applied to FIG. 6 according to the present invention.

Referring to FIG. 7, in a second embodiment of the present invention, a latch comprises a bracket 101 in a normal position, a first linkage 712, an L-shaped linkage 713 and a bracket latch component comprising a spring latch 723 and a button 109. The first linkage 712 is engaged with the threaded axle 103 of the bracket 101 by using washers 107 which provide friction and nuts 111. The first linkage 712 is connected to the L-shaped linkage 713 by a rivet 714. A longitudinal slot 720 is disposed on the horizontal side of the L-shaped linkage 713. A guide pin 719 passes through the longitudinal slot 720 and is fastened to the threaded stud (not shown) disposed on the inner side of one side panel of the housing 10, such that the L-shaped linkage 713 may rotate against the guide pin 719. The spring latch 723 is fastened to the inner side of the housing 10 by a rivet 721. The spring latch 723 does not include a recessed area 137 as in the first embodiment, but includes an opening 728 for engaging with the latch release pin 727 disposed on the inside of one side panel of the cover 20 as a latch to fasten the cover 20 to the housing 10.

When a user wants to open the cover 20, the user first presses the button 109 of the bracket latch component. The spring latch 723 bends to make the button 109 exit from the opening 105 on the bracket 101. The bracket 101 leaves the bracket latch state. The latch release pin 727 disposed on the inside of the cover 20 also exits from the opening 728 of the spring latch 723 to leave the latch state.

Figure 8:
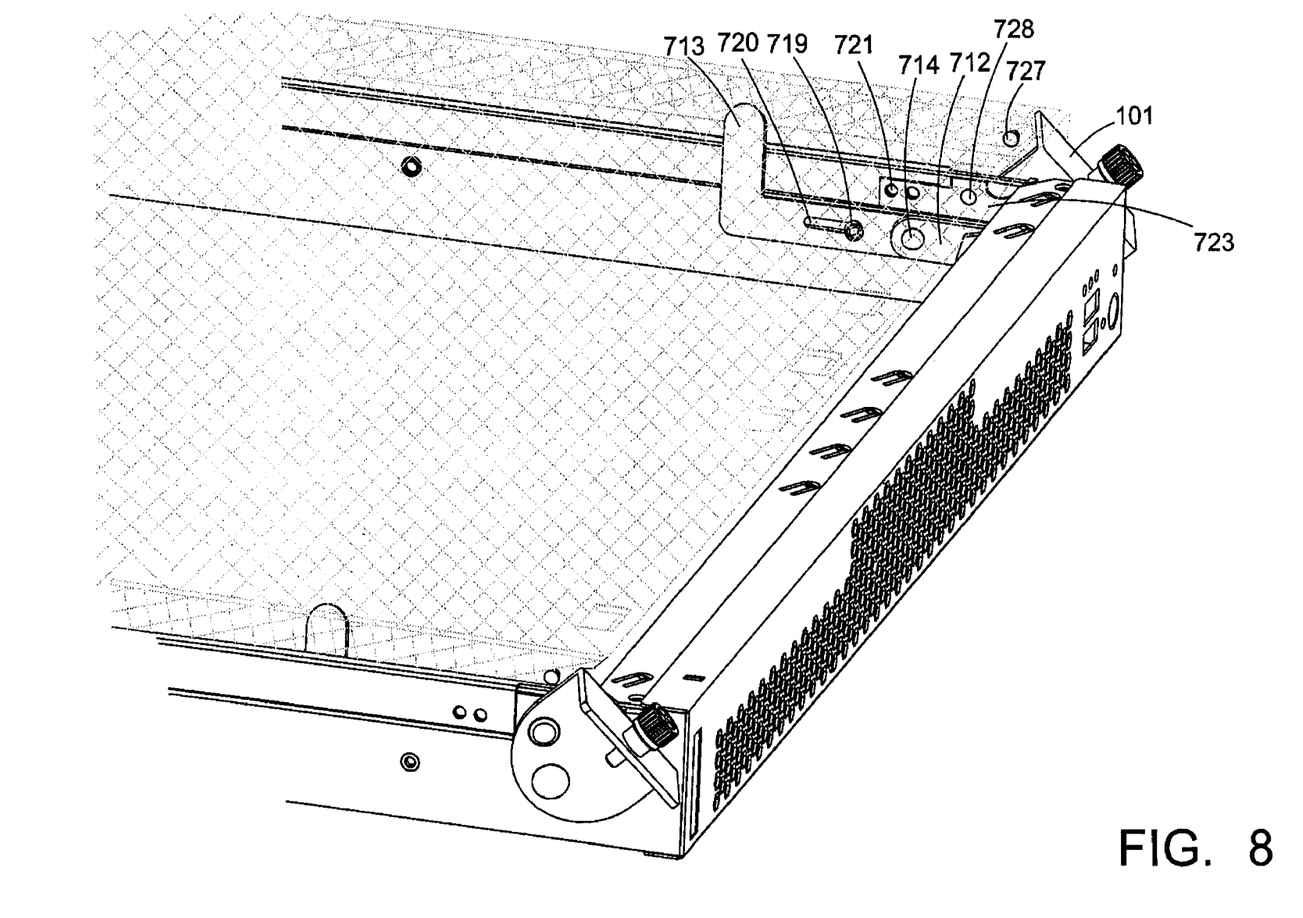
FIG. 8 shows an assembled perspective view according to a second embodiment of the present invention, wherein the cover and the housing are in a open state.

Next, the bracket 101 is rotated forward at an angle. The first linkage 712 and the L-shaped linkage 713 transform a rotation movement of the bracket 101 into an upward linear movement of the vertical side of the L-shaped linkage 713. The cover 20 is opened and lifted up a bit for removal convenience as shown in FIG. 8.

Figure 9:
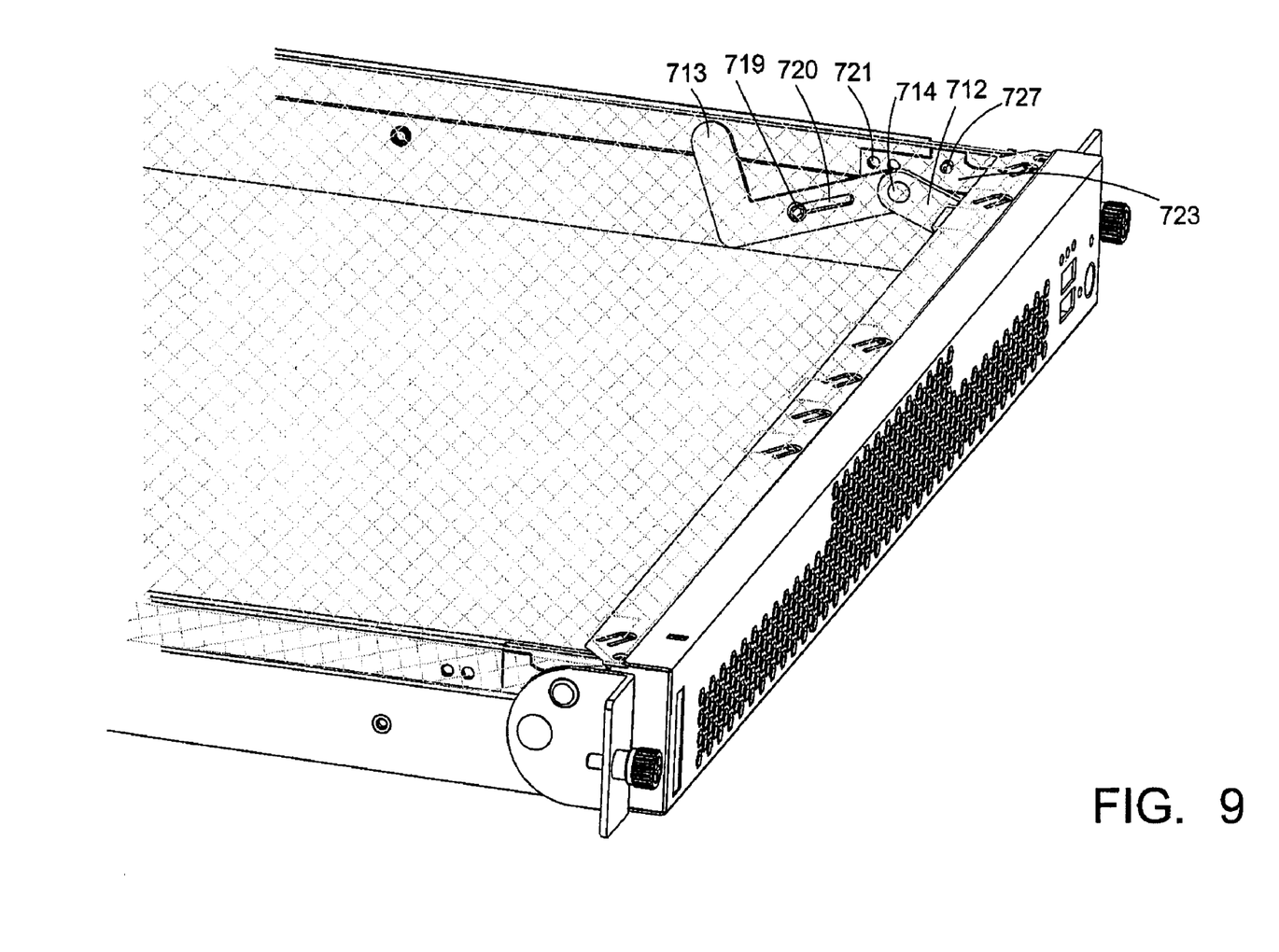
FIG. 9 shows an assembled perspective view according to the second embodiment of the present invention, wherein the cover latch, the cover and the housing are in a closed position.

Referring to FIG. 9, when closing the cover 20, the cover 20 will first be engaged with the housing 10 at the rear end at an angle. Cover 20 is then pressed downward. The latch release pin 727 disposed on the inside of at least one side panel of the cover 20 presses the spring latch 723 to bend it and detaches the button 109 of the bracket latch component from the opening 105 on the bracket 101. The bracket 101 leaves the bracket latch state.

The bracket 101 is turned backward at an angle to the normal position. The button 109 passes through the opening 105 of the bracket 101 to place the bracket 101 back in the bracket latch state. The latch release pin 727 passes through the opening 728 and returns back to the latch state to place the cover 20 back in the engaged and interlocked position with the housing 10.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A latch apparatus mounted on at least one side in a front of a housing, comprising:
    a bracket rotatably attached to at least one outer side in the front of the housing;
    a linkage means coupled to the bracket, whereby the linkage means applies a force on a cover relative to the housing for detachment of the cover from the housing when the bracket is rotated in a first direction; and
    a bracket latch component fastened to the housing, wherein the bracket comprises an opening and the bracket is put in a bracket latch state when the bracket latch component passes through the opening, wherein the bracket latch component comprises a spring latch and a button, and the bracket is placed in the bracket latch state and locked when the button passes through the opening, and the bracket leaves the bracket latch state when the button is pressed and the spring latch bends, detaching the button from the opening.

2. The latch apparatus according to claim 1, wherein the linkage means comprises a linkage set and a slide, the linkage set is coupled to the bracket and the linkage set transforms a rotation movement of the bracket into a displacement movement of the slide when the bracket is rotated in the first direction.

3. The latch apparatus according to claim 2, wherein the linkage set comprises a first linkage coupled to the bracket and a second linkage connected to the first linkage.

4. The latch apparatus according to claim 2, wherein the slide comprises a recessed cut disposed on an upper side of the slide and the slide is translated to move a stud disposed on a same side with the latch apparatus and on an inner side of the cover corresponding to the recessed cut when the bracket is rotated a first angle in the first direction.

5. The latch apparatus according to claim 4, wherein the recessed cut comprises a ramp and the slide is translated to move the stud upward adjacent to the ramp when the bracket is rotated a second angle in the first direction whereby the cover is opened and lifted up for removal, wherein the second angle is greater than the first angle.

6. The latch apparatus according to claim 1, wherein the spring latch comprises a recessed area and when the bracket is rotated an angle in a second direction back to a normal position, a latch release pin disposed on an inner side of one side panel of the cover slips into the recessed area, the button passes through the opening and places the bracket back in the bracket latch state whereby the bracket cannot be rotated, wherein the second direction is in a direction opposite to the first direction.

7. An enclosure, comprising:
    a cover;
    a housing;
    a latch apparatus mounted on at least one side in a front of the housing, comprising:
    a bracket rotatably attached to at least one outer side in the front of the housing; and
    a linkage means coupled to the bracket, whereby the linkage means applies a force on the cover relative to the housing for detachment of the cover from the housing when the bracket is rotated in a first direction, wherein the latch apparatus further comprises a bracket latch component fastened to the housing, wherein the bracket comprises an opening and the bracket is put in a bracket latch state when the bracket latch component passes through the opening, wherein the bracket latch component comprises a spring latch and a button, and the bracket is placed in the bracket latch state and locked when the button passes through the opening and the bracket leaves the bracket latch state when the button is pressed and the spring latch bends, detaching the button from the opening.

8. The enclosure according to claim 7, wherein the linkage means comprises a linkage set and a slide, the linkage set is coupled to the bracket and the linkage set transforms a rotation movement of the bracket into a displacement movement of the slide when the bracket is rotated in the first direction.

9. The enclosure according to claim 8, wherein the linkage set comprises a first linkage coupled to the bracket and a second linkage connected to the first linkage.

10. The enclosure according to claim 8, wherein the slide comprises a recessed cut disposed on an upper side of the slide and the slide is translated to move a stud disposed on a same side with the latch apparatus and on an inner side of the cover corresponding to the recessed cut when the bracket is rotated a first angle in the first direction.

11. The enclosure according to claim 10, wherein the recessed cut comprises a ramp, and when the bracket is rotated a second angle in the first direction, the slide is translated to move the stud upward adjacent to the ramp, whereby the cover is opened and lifted for removal, wherein the second angle is greater than the first angle.

12. The enclosure according to claim 11, wherein an L-shaped cut is disposed on the housing corresponding to the recessed cut, and when the bracket is rotated the first angle in the first direction, the stud exits from a horizontal side of the L-shaped cut whereby the cover leaves a closed position and is disengaged from the housing, and when the bracket is rotated the second angle in the first direction, the stud is moved upward along a vertical side of the L-shaped cut, whereby the cover is lifted up for removal.

13. The enclosure according to claim 12, wherein a latch release pin is disposed on a same side with the latch apparatus and on an inner side of the cover, and no matter what orientation the bracket is in, when the latch release pin aims at the spring latch, pressing the cover downward to the housing makes the latch release pin press the spring latch and bends it to detach the button from the opening, and the bracket leaves the bracket latch state and the stud acts with the ramp to adjust the position of the slide until the stud falls into the L-shaped cut.

14. The enclosure according to claim 13, wherein when being released from the bracket latch state, the bracket is rotated forward at an angle to facilitate aiming the latch release pin at the spring latch and pressing the cover downward to the housing.

15. The enclosure according to claim 7, wherein the spring latch comprises a recessed area and when the bracket is rotated at an angle in a second direction back to a normal position, a latch release pin disposed on an inner side of one side panel of the cover slips into the recessed area, the button passes through the opening to place the bracket back in the bracket latch state whereby the bracket cannot be rotated, wherein the second direction is in a direction opposite to the first direction.

16. The enclosure according to claim 15, wherein as the stud falls into the L-shaped cut and the bracket is rotated at an angle in the second direction back to the normal position, the linkage set transforms a rotation movement of the bracket into a displacement movement of the slide, and the stud placed within the recessed cut is pushed by the slide along a horizontal side of the L-shaped cut, whereby the cover is installed on the housing in a closed position.

* * * * *